(12) United States Patent
Gutmann

(10) Patent No.: US 9,857,417 B2
(45) Date of Patent: Jan. 2, 2018

(54) CLIMATE CHAMBER

(71) Applicant: Micronas GmbH, Freiburg (DE)

(72) Inventor: Johannes Gutmann, Staufen (DE)

(73) Assignee: TDK-Micronas GmbH, Freiburg (DE)

( * ) Notice: Subject to any disclaimer, the term of this patent is extended or adjusted under 35 U.S.C. 154(b) by 0 days.

(21) Appl. No.: 15/227,596

(22) Filed: Aug. 3, 2016

(65) Prior Publication Data

US 2017/0038429 A1     Feb. 9, 2017

(30) Foreign Application Priority Data

Aug. 3, 2015    (DE) .......................... 10 2015 009 795

(51) Int. Cl.
    *G01R 31/10*      (2006.01)
    *G01R 31/28*      (2006.01)

(52) U.S. Cl.
    CPC ..... *G01R 31/2874* (2013.01); *G01R 31/2862* (2013.01)

(58) Field of Classification Search
    CPC ............ G01R 31/2874; G01R 31/2862; G01R 31/2856; G01R 31/286; G01R 31/2865; G01R 31/2867; G01R 31/2868; G01R 31/2866; G01R 31/2886; G01R 1/18; G01R 31/07342; G01R 31/06711; G01R 31/06772; G01R 31/31924; G01R 31/31922; G01R 31/31937; G01R 31/2893
    USPC ............ 324/750.01, 750.03–750.09, 750.13, 324/750.26, 750.28, 757.01
See application file for complete search history.

(56) References Cited

U.S. PATENT DOCUMENTS

| | | | | |
|---|---|---|---|---|
| 5,397,998 A | * | 3/1995 | Soeno ................ | G01R 31/2849 324/750.07 |
| 5,892,367 A | * | 4/1999 | Magee ............... | G01R 31/2862 324/750.14 |
| 5,929,340 A | | 7/1999 | Cochran et al. | |
| 6,373,270 B1 | * | 4/2002 | Cochran ............ | G01R 31/2817 165/61 |
| 6,564,165 B1 | * | 5/2003 | Mailloux ........... | G01R 31/2868 374/57 |

(Continued)

FOREIGN PATENT DOCUMENTS

| | | |
|---|---|---|
| DE | 38 21 468 A1 | 12/1989 |
| DE | 40 35 177 A1 | 5/1992 |

(Continued)

*Primary Examiner* — Thang Le
(74) *Attorney, Agent, or Firm* — Muncy, Geissler, Olds & Lowe, P.C.

(57) ABSTRACT

A climate chamber for measuring electronic circuits, having a housing that includes an interior space and an opening. The interior space is at least thermally insulated from the surroundings by the housing. Two movable jaws each have an end face. An interior space in a region of an opening is distanced from the surroundings according to the thickness of the jaws, and the jaws each comprise a thermal insulation layer, and each jaw has a front side facing the surroundings and a back side facing the interior space. The two jaws are spaced apart by a clear width being formed between the two end faces, so that the circuits disposed on a carrier can be introduced into the climate chamber and in a second state, the opening for the protection of the interior space is sealed against ambient conditions.

14 Claims, 2 Drawing Sheets

(56) References Cited

U.S. PATENT DOCUMENTS 6,803,547 B2 10/2004 Tanaka et al.
7,213,477 B2 5/2007 Johnson

FOREIGN PATENT DOCUMENTS

DE  20 2006 019 983 U1  7/2007
DE  10 2007 023 926 B4  3/2012

\* cited by examiner

CLIMATE CHAMBER

This nonprovisional application claims priority under 35 U.S.C. §119(a) to German Patent Application No. 10 2015 009 795.4, which was filed in Germany on Aug. 3, 2015, and which is herein incorporated by reference.

BACKGROUND OF THE INVENTION

Field of the Invention

The invention relates to a climate chamber for measuring electronic components.

Description of the Background Art

From DE 10 2007 023 926 B4, DE 40 35 177 C2, DE 20 2006 019 983 U1 and DE 38 21 468 C2, different methods and devices for thermal shielding of devices are known.

SUMMARY OF THE INVENTION

It is therefore an object of the invention to provide a device which further develops the prior art.

In an exemplary embodiment, a climate chamber is provided for measuring electronic components, wherein the climate chamber comprises a housing, wherein the housing comprises an interior space and an opening, and the interior space is at least thermally insulated from the surroundings by means of the housing, and wherein the climate chamber comprises two movable jaws, each jaw having a width and a height and thickness, and each jaw having an end face, wherein the thickness and the width of the surface of the respective jaw determines the respective end face and both end faces of the two jaws are located opposite one another and the surfaces of the end faces form mutually parallel planes and the interior space is distanced from the surroundings in the area of the opening corresponding to the thickness of the jaws and the jaws each comprise a thermal insulation layer, and each jaw has a front side facing the surroundings and a back side facing the interior space, wherein the size of the two surfaces is in each case determined by the width and the height of the respective jaw and in a first state, the two jaws are spaced apart by a clear width formed between the two end faces, so that the components disposed on a carrier can be introduced into the interior space and in a second state, the opening is sealed against ambient conditions for the protection of the interior, wherein the components are connected by means of an electrical connection and the electrical connection is guided between the two jaws, and the end face of one of the two jaws and the end face of the other jaw are in each case non-positively connected with the electrical connection.

The electronic components can be present as housed circuits, so-called ICs, and that by means of the climate chamber, the circuits can be measured at predetermined temperatures and humidity conditions. Particularly in sub-zero temperatures, electrical shorts due to water condensation can be avoided. It is understood that in the climate chamber, the gas composition is also easy to specify, in particular, it is also possible to measure under a pure nitrogen atmosphere. Climate chambers are particularly used during the final measurement in the so-called "final test".

Between the front side and the back side, the disposed thermal insulation layer can also include an air gap or, for example, an air layer. In this way, each of the jaws have a sandwich structure. In particular, in an embodiment with the thermal insulation layer being an air layer, any of the two jaws can be regarded as a jaw having two partial jaws, wherein respectively, the front side can be formed with the first partial jaw and respectively, the back side can be formed with the second partial jaw.

In an embodiment, the carrier can be plate-shaped, wherein in each case the end face of one of the two jaws is non-positively connected with a top side of the carrier and the end face of the other jaw is non-positively connected with an underside of the carrier.

In an embodiment, the thermal insulation layer can be positioned between a first actively tempered partial jaw and a second partial jaw, wherein the first partial jaw is adjacent to the interior space, exhibiting the temperature of the interior space, and the second partial jaw is adjacent to the surroundings so that a temperature difference between the interior space and the surroundings drops. Further, an active temperature control via a fluid can have an advantageous effect. In particular, water or oil can be used therefor.

In an embodiment, both jaws on the respective end faces can be thermally coupled to the top side and the underside of the carrier so that at the border to the interior space, the internal temperature assumes the interior temperature and at the border to the surroundings, the carrier assumes the ambient temperature.

In an embodiment, the opening is sealed by the two jaws and the intermediate carrier, and the carrier is clamped between both end faces. It is particularly advantageous when the second partial jaw is also designed as an actively tempered partial jaw and exhibits the ambient temperature, so that a temperature difference between the interior space and the surroundings between the two actively tempered partial jaws drops. By both partial jaws having an active temperature control, the carrier can be particularly simply thermally coupled thereto. Furthermore, it is possible to reliably align the portion of the carrier located outside of the climate chamber with the ambient temperature, particularly when the climate chamber temperature is up to 180° C. or down to −50° C. An advantage is that due to the active temperature control of the carrier, no undesired temperature gradient across the carrier is influenced, and in particular, the thermally particularly well-conducting conductor tracks do not influence the measurements of the electronic components, in particular, of circuits in the climate chamber.

In an embodiment, the two partial jaws can cover the entire front side and the entire back side of the respective jaw. The active temperature control allows for the predetermined temperature to be better maintained, particularly inside the interior space.

In an embodiment, the carrier can be substantially or exactly the same width as one of the jaws. Furthermore, it is advantageous when the two jaws have a same thickness and a same width.

In an embodiment, a plurality of conductor tracks and contact portions for one or more circuits is available on the top side of the carrier. To this end, the conductor tracks are in electrical operative connection with the contact portions and the contact portions are configured to electrically contact one or more circuits.

In an embodiment, the surface of the front side and the surface of the back side of the respective jaws can form mutually parallel planes.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
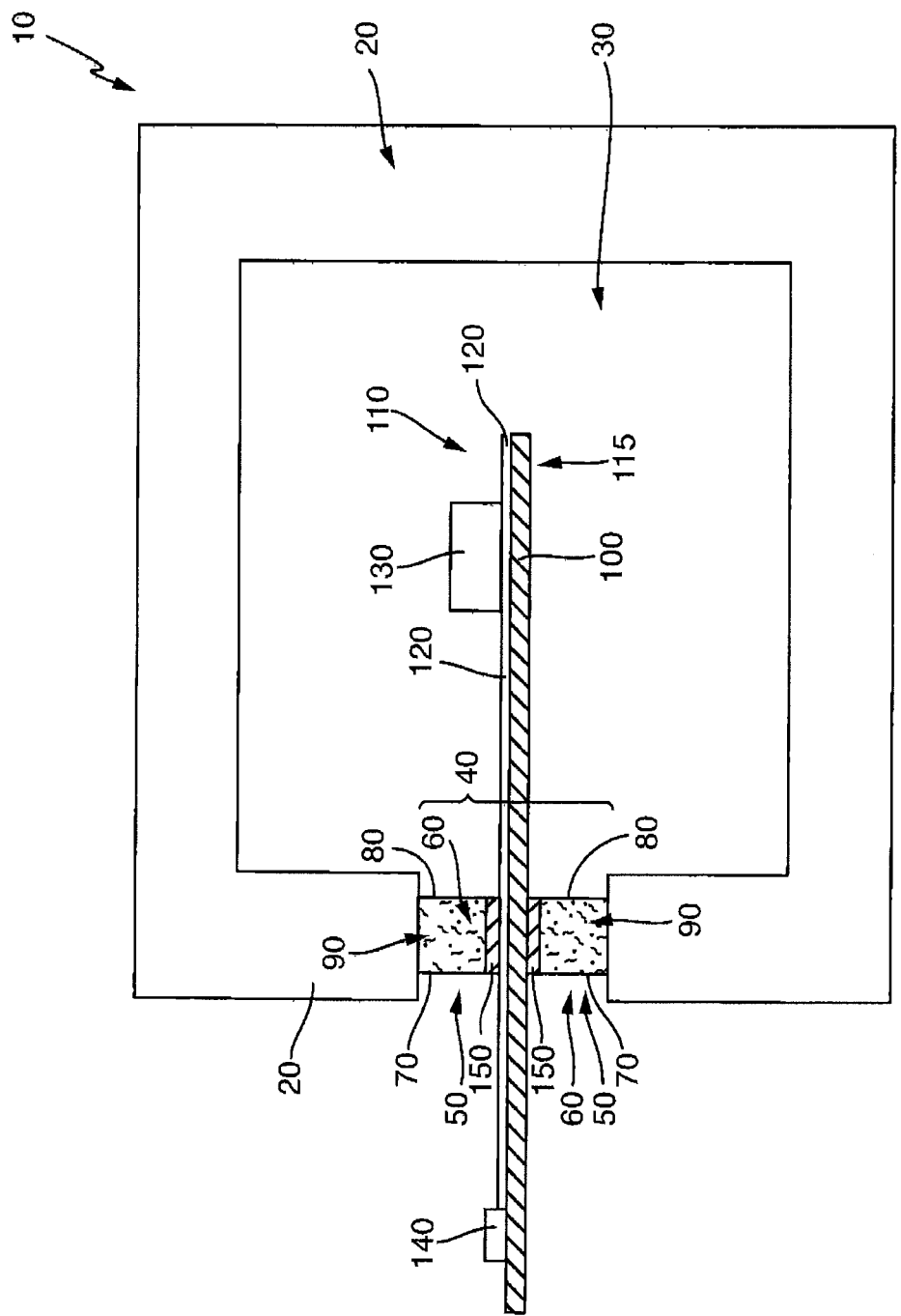
FIG. 1 illustrates a view of an exemplary embodiment of a climate chamber.

The illustration in FIG. 1 shows a view of a first embodiment, comprising a climate chamber 10 for measuring electronic circuits, having a housing 20, wherein the housing comprises an interior space 30 and an opening 40. The interior space 30 is at least thermally insulated from the surroundings by the housing 20. The opening 40 can be sealed by two movable jaws 50. In addition to an end face 60, each jaw 50 has a width and a height and a thickness. The surface of the end face is determined by the thickness and the width of each jaw 50. The end faces 60 of the two jaws 50 are opposite one another and form mutually parallel planes.

In the area of the opening 4, the interior space 30 is distanced from the surroundings according to the thickness of the jaws 50. The jaws 50 include a front side 70 facing the surroundings, having a first partial jaw 52, and a back side 80 facing the interior space, having a second partial jaw 54. The surface of the front side 70 and the surface of the back side 80 preferably form mutually parallel planes. A thermal insulation layer 90 is disposed between the front side 70 and the back side 80. In this way, each of the jaws 50 have a sandwich structure. In other words, in particular in an embodiment with the thermal insulating layer 90 being a layer of air, each of the two jaws can be regarded as a jaw 50 having two partial jaws 52 and 54 with an intermediate air layer, wherein the front side 70 is formed respectively with the first part jaw 52, and the back side 80 is formed respectively with the second partial jaw 54.

For the two jaws 50, the size of the two surfaces, i.e., the size of the front side 70 and the size of the back side 80 are each determined by the width and height of each jaw 50.

In a first state, the two jaws 50 are spaced apart from each other by a clear width being formed between the two end faces 60.

In the illustrated second state, the opening 40 is locked by the two jaws 50 and a carrier 100. A plate-shaped carrier 100, preferably constructed as a circuit board, is arranged between the two jaws 50. The carrier 100 is hereby held between the jaws 50. A first portion of the carrier 100 is disposed within the climate chamber, a second portion of the carrier is disposed outside the climate chamber 10, and a third portion of the carrier is arranged between the two jaws 50. The carrier 100 has a top side 110 and an underside 115. On the top side 110, a plurality of conductor paths 120 are disposed on the carrier 100, wherein presently only one conductor track is visible. On the first portion in a receiving area, an IC receiving unit 130 and several contacts 140 that are arranged on the second portion are provided, the contacts 140 being at least partially connected with the IC receiving unit 130 by means of the conductor tracks 120.

In the exemplary embodiment, one of the end faces 60 is pressed onto the top side 110 and the other end face 60 is pressed onto the underside 115. In order to improve the heat transfer to the jaws, in each case a layer 150 to improve thermal coupling is formed between the end face 60 on the top side 110 and the end face 60 on the underside 115. For such layers 150, in particular conductive pastes or elastic heat-conducting films are used.

In the example embodiment, both jaws have the same thickness and the same width. The carrier 100 is substantially or exactly the same width as the two jaws 50.

Figure 2:
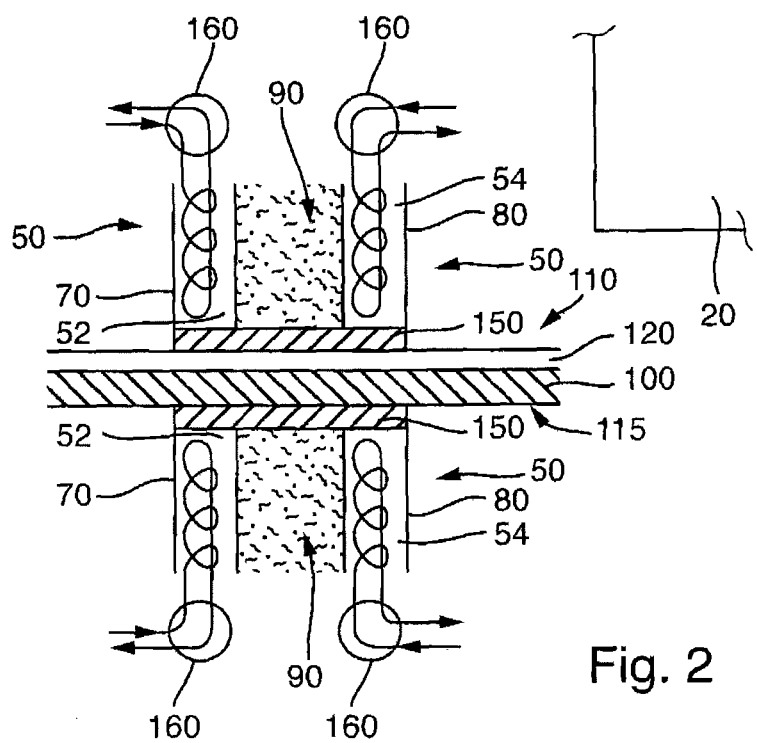
FIG. 2 illustrates a detailed view of an embodiment having two actively tempered jaws.

The illustration in FIG. 2 shows a detailed view of an embodiment with two actively tempered jaws 50. In the following, only the differences from the picture in FIG. 1 are explained. The jaws 50 each have a sandwich structure, wherein the first partial jaw 52 and the second partial jaw 54 are each actively temperature-controlled with a heating/cooling coil 160. The heating/cooling coils 160 are traversed by a fluid. Alternatively, the active temperature control of the two jaws 52, 54 can also be achieved by a traversed pipe or square hollow profile. Here, the second partial jaw 54 exhibits the temperature of the interior space of the climate chamber, and the first partial jaw 52 exhibits the ambient temperature, so that a temperature difference between the interior space 30 and the area between the two partial jaws 52, 54 falls.

Figure 3:
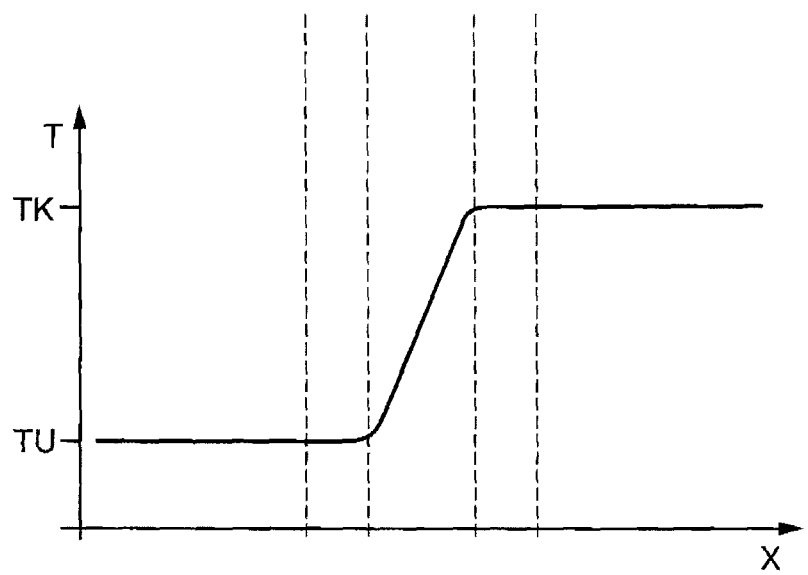
FIG. 3 illustrates a temperature profile of the carrier for the embodiment, as shown in FIG. 2.

The illustration in FIG. 3 maps a temperature profile of the carrier for the embodiment shown in FIG. 2. Below, only the differences from the illustration in FIG. 1 are explained. The figures show that at the border to the interior space, the carrier 100 already exhibits the sample temperature TK of the interior space 30 of the climate chamber 10. The same applies to the carrier 100 on the border to the ambient area by the carrier assuming the ambient sample temperature TU. One advantage is that the active temperature control of the carrier 100 aligns the temperatures and no undesired temperature gradient affects the measurement of the electronic circuits in the climate chamber 10 via the carrier 100 and in particular, via the thermally especially well-conducting conductor tracks 120.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A climate chamber for measuring electronic components, the climate chamber comprising:
    a housing that comprises an interior space and an opening, the interior space being at least thermally isolated from external surroundings by the housing;
    two movable jaws that each have a width and a height and a thickness and an end face, the thickness and width of the respective jaw determining a surface of the end face, the two end faces of the two jaws being opposite to each other and the surfaces of the end faces forming mutually parallel planes,
    wherein the interior space adjacent to the opening is distanced from the external surroundings according to the thickness of the jaws,
    wherein each of the two jaws have a thermal insulation layer, and each jaw has a front side that faces the external surroundings and a back side that faces the interior space, a size of the front side and back side being determined by the width and the height of each jaw, wherein, in a first state, the two jaws are spaced apart by a clear width being formed between the two end faces so that the electronic components arranged on a carrier, the carrier being connected to the electronic components for moving the electronic components into the interior space, wherein, in a second state, the opening, for the protection of the interior space, is sealed against ambient conditions, and wherein the electronic components are connected by an electrical connection and the electrical connection is guided between the two jaws, and the end face of one of the two jaws and the end face of the other jaw are each non-positively connected with the electrical connection.

2. The climate chamber according to claim 1, wherein the two jaws at the respective end face are thermally coupled with a top side and with an underside of the carrier so that at a border to the interior space, the carrier assumes an internal temperature, and at the border to the surroundings the carrier assumes the ambient temperature.

3. The climate chamber according to claim 1, wherein the opening is sealed by the two jaws and the carrier, and wherein the carrier is clamped between the two end faces.

4. The climate chamber according to claim 1, wherein the carrier is substantially equal in width with one of the jaws.

5. The climate chamber according to claim 1, wherein the two jaws have identical thicknesses and identical widths.

6. The climate chamber according to claim 1, wherein on a top side of the carrier, a plurality of conductor paths and contact regions for one or more circuits are provided, and wherein the conductor paths are in electrical operative connection with the contact regions and the contact regions are arranged to electrically contact one or more circuits.

7. The climate chamber according to claim 1, wherein the surface of the front side and the surface of the back side form mutually parallel planes.

8. The climate chamber according to claim 1, wherein the thermal insulating layer has an air layer and each of the two jaws comprises two partial jaws, wherein in each case the front side is formed of the first partial jaw and respectively the back side of the second partial jaw.

9. The climate chamber according to claim 1, wherein the carrier is plate-shaped and the end face of one of the two jaws is in each case non-positively connected with a top side of the carrier, and wherein the end face of the other jaw with an underside of the carrier.

10. The climate chamber according to claim 1, wherein the carrier and the electronic components are suspended in the interior space.

11. A climate chamber for measuring electronic components, the climate chamber comprising:
a housing that comprises an interior space and an opening, the interior space being at least thermally isolated from external surroundings by the housing;
two movable jaws that each have a width and a height and a thickness and an end face, the thickness and width of the respective jaw determining a surface of the end face, the two end faces of the two laws being opposite to each other and the surfaces of the end faces forming mutually parallel planes,
wherein the interior space adjacent to the opening is distanced from the external surroundings according to the thickness of the jaws,
wherein each of the two jaws have a thermal insulation layer, and each jaw has a front side that faces the external surroundings and a back side that faces the interior space, a size of the front side and back side being determined by the width and the height of each jaw,
wherein, in a first state, the two jaws are spaced apart by a clear width being formed between the two end faces so that the electronic components arranged on a carrier are adapted to be introduced into the interior space,
wherein, in a second state, the opening, for the protection of the interior space, is sealed against ambient conditions,
wherein the electronic components are connected by an electrical connection and the electrical connection is guided between the two jaws, and the end face of one of the two jaws and the end face of the other jaw are each non-positively connected with the electrical connection, and
wherein the thermal insulation layer is formed between a first actively temperature-controlled partial jaw and a second temperature-controlled partial jaw, wherein the second partial jaw borders on the interior space and exhibits the temperature of the interior space and the first partial jaw borders on the surroundings so that a temperature difference between the interior space and the surroundings between the two partial jaws drops.

12. The climate chamber according to claim 11, wherein active temperature control by the two partial jaws is effected by a fluid.

13. The climate chamber according to claim 11, wherein the first partial jaw is formed as an actively temperature-controlled partial jaw and exhibits the temperature of the surroundings so that a temperature difference between the interior space and the surroundings between the two actively temperature-controlled partial jaws drops.

14. The climate chamber according to claim 11, wherein the two partial jaws cover the entire front side and the entire back side of each jaw.

* * * * *